: US 11,340,643 B2
(45) Date of Patent: May 24, 2022

(12) United States Patent
Hu (54) LINEAR REGULATOR CIRCUIT AND SIGNAL AMPLIFIER CIRCUIT HAVING FAST TRANSIENT RESPONSE (71) Applicant: Richtek Technology Corporation, Zhubei (TW)

(72) Inventor: Min-Hung Hu, New Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 111 days.

(21) Appl. No.: 17/033,810

(22) Filed: Sep. 27, 2020

(65) Prior Publication Data
US 2021/0191439 A1 Jun. 24, 2021

(30) Foreign Application Priority Data

Dec. 20, 2019 (TW) .................................. 108147078

(51) Int. Cl.
*G05F 1/575* (2006.01)
*H03F 3/45* (2006.01)
(52) U.S. Cl.
CPC ......... *G05F 1/575* (2013.01); *H03F 3/45269* (2013.01)
(58) Field of Classification Search
CPC ... G05F 1/575; G05F 1/59; G05F 1/61; G05F 1/613; G05F 1/614; G05F 1/618; G05F 1/56; H03F 3/45269
See application file for complete search history.

(56) References Cited

U.S. PATENT DOCUMENTS

| 8,344,712 B2 | 1/2013 | Martin et al. | |
|---|---|---|---|
| 2011/0121800 A1* | 5/2011 | Drebinger | G05F 1/575 323/273 |
| 2015/0130434 A1* | 5/2015 | Jain | G05F 1/575 323/280 |
| 2015/0177760 A1* | 6/2015 | Ozanoglu | G05F 1/575 323/273 |

* cited by examiner

*Primary Examiner* — Nguyen Tran
(74) *Attorney, Agent, or Firm* — Tung & Associates (57) ABSTRACT A linear regulator circuit having fast transient response includes an error amplifier (EA) circuit and an output stage circuit. The EA circuit amplifies a difference between a feedback signal and a reference signal to generate an error amplified signal. The output stage circuit includes at least one output power switch which is controlled by the error amplified signal to generate an output signal at an output node. The EA circuit includes at least one pre-stage amplifier circuit which includes a current source circuit, a differential input circuit, a first, a second and a third current mirror circuits and at least one feedback capacitor. One differential transistor of the differential input circuit, the first and the second current mirror circuit form a positive potential feedback (PPFB) loop. The feedback capacitor is coupled between the output node and at least one inverting node at the PPFB loop.

19 Claims, 8 Drawing Sheets

LINEAR REGULATOR CIRCUIT AND SIGNAL AMPLIFIER CIRCUIT HAVING FAST TRANSIENT RESPONSE

CROSS REFERENCE

The present invention claims priority to TW 108147078, filed on Dec. 20, 2019.

BACKGROUND OF THE INVENTION

Field of Invention

The present invention relates to a linear regulator circuit, particularly to a linear regulator circuit which has fast transient response. The present invention also relates to a signal amplifier circuit which has fast transient response.

Description of Related Art

The following prior art document is relevant to the present invention: "LDO Linear Regulator with Improved Transient Response (U.S. Pat. No. 8,344,712 B2)".

Figure 1:
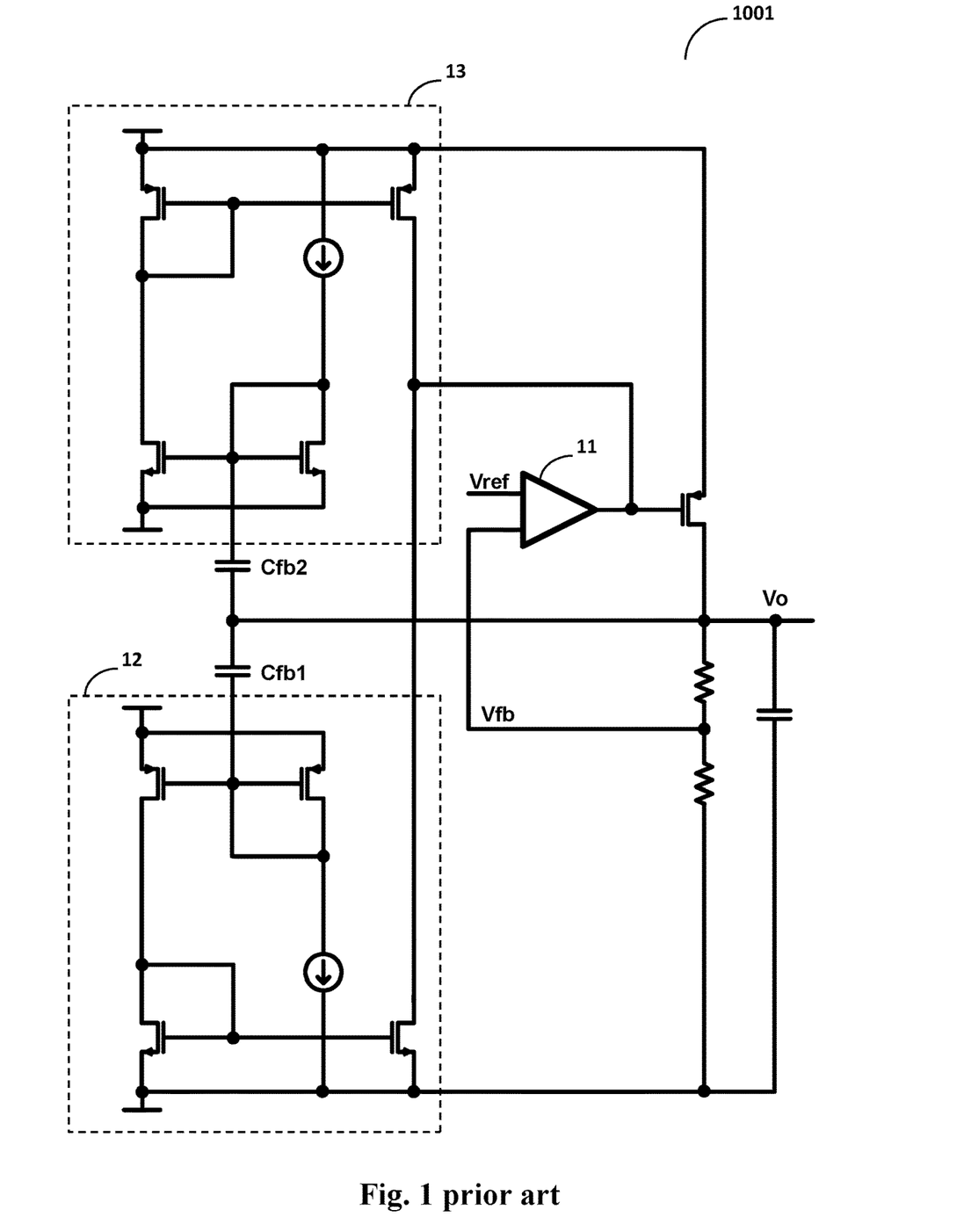
FIG. 1 shows a prior art linear regulator circuit.

FIG. 1 shows a prior art linear regulator circuit 1001, wherein an error amplifier circuit 11 is configured to operably control a DC loop to regulate a DC component of an output signal Vo according to a reference signal Vref. On the other hand, the capacitors Cfb1 and Cfb2 and the current source circuits 12 and form an AC loop, for accelerating the transient response responsive to the change of the output signal Vo.

The prior art shown in FIG. 1 has the following drawbacks. First, the prior art linear regulator circuit 1001 requires a full-scale error amplifier circuit 11 and at least four current mirror circuits (current source circuit 12 and 13), so the power consumption is much more than a general linear regulator circuit. Second, the error amplifier circuit 11 and the current source circuits 12 and 13 which form the AC loop require individual frequency compensation for stability, which increases the circuit complexity and difficulty in circuit design. Furthermore, the prior art linear regulator circuit 1001 includes a slow-response DC loop (the error amplifier circuit 11) and a fast-response AC loop (the current source circuits 12 and 13); the DC loop and the AC loop are independent from each other but they both control the power transistor, which may cause conflict to affect the stability.

Compared with the prior art of FIG. 1, the present invention is advantageous in low quiescent power consumption, high efficiency and fast response; besides, the DC loop and the AC loop of the present invention feed back to the same node, which makes the compensation design simpler.

SUMMARY OF THE INVENTION

From one perspective, the present invention provides a linear regulator circuit having fast transient response, comprising: an error amplifier circuit, configured to operably amplify a difference between a feedback signal and a reference signal to generate an error amplified signal at a driving node; an output stage circuit, including at least one output power switch which is controlled by the error amplified signal to generate an output signal at an amplifying output node; and a regulation feedback circuit, configured to operably generate the feedback signal according to the output signal; wherein the error amplifier circuit includes: at least one pre-stage amplifier circuit which includes: a current source circuit, configured to operably provide a bias current at a common source node of the pre-stage amplifier circuit; a differential input circuit, including a first differential transistor and a second differential transistor, wherein a source of the first differential transistor and a source of the second differential transistor are coupled together at the common source node, and a gate of the first differential transistor is coupled to a pre-stage first input terminal of the pre-stage amplifier circuit, and a gate of the second differential transistor is coupled to a pre-stage second input terminal of the pre-stage amplifier circuit, wherein the first differential transistor and the second differential transistor are configured to operably generate a differential output current according to a voltage difference between the pre-stage first input terminal and the pre-stage second input terminal; a first current mirror circuit, coupled with a drain of the second differential transistor at a differential stage output node of the pre-stage amplifier circuit, and configured to operably generate a first output current at a gain node according to the differential output current; a second current mirror circuit, configured to operably generate a second output current at the common source node according to the first output current; a third current mirror circuit, configured to operably generate a pre-stage amplified signal at a pre-stage output terminal of the pre-stage amplifier circuit according to the first output current, wherein the first current mirror circuit, the second differential transistor and the second current mirror circuit form a positive potential feedback (PPFB) loop; and at least one feedback capacitor, coupled between a pre-stage third input terminal of the pre-stage amplifier circuit and at least one inverting node of the pre-stage amplifier circuit, wherein on a signal feedforward path, a voltage of each of the inverting nodes has an inverting relationship with a voltage of the amplifying output node; wherein one of the pre-stage first input terminal and the pre-stage second input terminal of each pre-stage amplifier circuit is coupled to the feedback signal, and the other one is coupled to the reference signal, and the pre-stage third input terminal is coupled to the amplifying output node, and the pre-stage output terminal is coupled to the driving node, and the pre-stage amplified signal corresponds to the error amplified signal; wherein when a transient signal occurs at the amplifying output node, an acceleration signal is generated at the corresponding inverting node through the at least one feedback capacitor, to accelerate the transient response of the output signal.

In one embodiment, the at least one feedback capacitor of each pre-stage amplifier circuit includes a first feedback capacitor, coupled between the pre-stage third input terminal of the pre-stage amplifier circuit and an inverting node on the PPFB loop.

In one embodiment, the first feedback capacitor is coupled between the pre-stage third input terminal of the corresponding pre-stage amplifier circuit and the common source node, whereby when a transient signal occurs at the pre-stage third input terminal, a first acceleration signal is generated at the common source node to accelerate a transient response of a current on the PPFB loop, whereby the transient response of the output signal is accelerated.

In one embodiment, the first current mirror circuit is configured as a cascoded current mirror circuit, wherein the at least one feedback capacitor further includes a second feedback capacitor which is coupled between the pre-stage third input terminal of the pre-stage amplifier circuit and a current input cascode node of the first current mirror circuit, whereby when a transient signal occurs at the pre-stage third input terminal, a second acceleration signal is generated at the current input cascode node, wherein the first acceleration signal and the second acceleration signal are configured to operate in a push-pull manner to accelerate the transient current on the PPFB loop; wherein the current input cascode node is a node where plural cascode transistors on a current input path of the first current mirror circuit are coupled together.

In one embodiment, the first current mirror circuit includes a first cascode transistor, a second cascode transistor, a third cascode transistor and a fourth cascode transistor, wherein the first cascode transistor and the second cascode transistor are cascoded at the current input cascode node to receive the differential output current, and the third cascode transistor and the fourth cascode transistor are cascoded at a current output cascode node of the first current mirror circuit to generate the first output current, wherein a gate of the first cascode transistor and a gate of the third cascode transistor are coupled to the differential stage output node, and a gate of the second cascode transistor and a gate of the fourth cascode transistor are coupled to a first bias voltage.

In one embodiment, the third current mirror circuit is configured as a cascoded current mirror circuit, wherein the at least one feedback capacitor includes a third feedback capacitor which is coupled between the pre-stage third input terminal of the pre-stage amplifier circuit and a current output cascode node of the third current mirror circuit, whereby when a transient signal occurs at the pre-stage third input terminal, a third acceleration signal is generated at the current output cascode node of the third current mirror circuit to accelerate the transient response of the output signal; wherein the current output cascode node is a node on which plural cascode transistors on a current output path of the third current mirror circuit are coupled together.

In one embodiment, the third current mirror circuit includes a fifth cascode transistor, a sixth cascode transistor, a seventh cascode transistor and an eighth cascode transistor, wherein the fifth cascode transistor and the sixth cascode transistor are cascoded at a current input cascode node of the third current mirror circuit to receive the first output current, and the seventh cascode transistor and the eighth cascode transistor are cascoded at the current output cascode node of the third current mirror circuit to generate a fourth output current, wherein a gate of the fifth cascode transistor and a gate of the seventh cascode transistor are coupled to the gain node, and a gate of the sixth cascode transistor and a gate of the eighth cascode transistor are coupled to a second bias voltage.

In one embodiment, the at least one feedback capacitor includes a fourth feedback capacitor which is coupled between the pre-stage third input terminal of the pre-stage amplifier circuit and the driving node.

In one embodiment, the first differential transistor and the second differential transistor are both first conductive type transistors, and the first, second, third and fourth cascode transistor are all second conductive type transistors, and the fifth, sixth, seventh and eighth cascode transistor are all first conductive type transistors.

In one embodiment, the second current mirror circuit is configured as a cascoded current mirror circuit, including the fifth cascode transistor, the sixth cascode transistor, a ninth cascode transistor and a tenth cascode transistor, wherein the ninth cascode transistor and the tenth cascode transistor are cascoded at a current output cascode node of the second current circuit to generate the second output current at the common source node, and the gate of the fifth cascode transistor and a gate of the ninth cascode transistor are coupled to the gain node, and the gate of the sixth cascode transistor and a gate of the tenth cascode transistor are coupled to the second bias voltage.

In one embodiment, the gate of the second cascode transistor and the gate of the fourth cascode transistor are coupled to the differential output node, wherein a voltage of the differential output node corresponds to the first bias voltage, wherein absolute values of conduction threshold voltages of the second cascode transistor and the fourth cascode transistor are smaller than absolute values of conduction threshold voltages of the first cascode transistor and the third cascode transistor.

In one embodiment, the gate of the sixth, the eighth and the tenth cascode transistor are coupled to the gain node, wherein a voltage of the gain node corresponds to the second bias voltage, wherein absolute values of conduction threshold voltages of the sixth, the eighth and the tenth cascode transistor are smaller than absolute values of conduction threshold voltages of the fifth, the seventh and the ninth cascode transistor.

In one embodiment, the output power switch is configured as a PMOS transistor.

In one embodiment, the at least one pre-stage amplifier circuit includes a first pre-stage amplifier circuit and a second pre-stage amplifier circuit, which are in complementary configuration, wherein the first conductive type of the first pre-stage amplifier circuit corresponds to N-type and the second conductive type of the first pre-stage amplifier circuit corresponds to P-type, and the first conductive type of the second pre-stage amplifier circuit corresponds to P-type and the second conductive type of the second pre-stage amplifier circuit corresponds to N-type.

In one embodiment, when operating in a quiescent state, each differential transistor and each cascode transistor operate in a subthreshold region.

In another aspect, the present invention provides a linear regulator circuit having fast transient response, comprising: an error amplifier circuit, configured to operably amplify a difference between a feedback signal and a reference signal to generate an error amplified signal at a driving node; an output stage circuit, including at least one output power switch which is controlled by the error amplified signal to generate an output signal at an amplifying output node; and a regulation feedback circuit, configured to operably generate the feedback signal according to the output signal; wherein the error amplifier circuit includes: at least one pre-stage amplifier circuit which includes: a current source circuit, configured to operably provide a bias current at a common source node of the pre-stage amplifier circuit; a differential gain stage circuit, configured to operably generate a gain output voltage of a gain node according to a voltage difference between a pre-stage first input terminal and a pre-stage second input terminal of the pre-stage amplifier circuit; a first transconductor circuit, configured to operably generate a feedback current at the common source node according to the gain output voltage; a second transconductor circuit, configured to operably generate a fourth output current according to the gain output voltage, for generating a pre-stage amplified signal at a pre-stage output terminal of the pre-stage amplifier circuit, wherein the differential gain stage circuit and the first transconductor circuit form a positive potential feedback (PPFB) loop; and at least one feedback capacitor, coupled between a pre-stage third input terminal of the pre-stage amplifier circuit and at least one inverting node of the pre-stage amplifier circuit, wherein on a signal feedforward path, a voltage of each of the inverting nodes has an inverting relationship with a voltage of the amplifying output node; wherein one of the pre-stage first input terminal and the pre-stage second input terminal of each pre-stage amplifier circuit is coupled to the feedback signal, and the other one is coupled to the reference signal, and the pre-stage third input terminal is coupled to the amplifying output node, and the pre-stage output terminal is coupled to the driving node, and the pre-stage amplified signal corresponds to the error amplified signal; wherein when a transient signal occurs at the amplifying output node, an acceleration signal is generated at the corresponding inverting node through the at least one feedback capacitor, to accelerate the transient response of the output signal.

In another aspect, the present invention provides a signal amplifier circuit, comprising: an error amplifier circuit, configured to operably amplify a voltage difference between a first input signal and a second input signal to generate an error amplified signal at a driving node; and an output stage circuit, including at least one output power switch which is controlled by the error amplified signal to generate an output signal at an amplifying output node; wherein the error amplifier circuit includes: at least one pre-stage amplifier circuit which includes: a current source circuit, configured to operably provide a bias current at a common source node of the pre-stage amplifier circuit; a differential input circuit, including a first differential transistor and a second differential transistor, wherein a source of the first differential transistor and a source of the second differential transistor are coupled together at the common source node, and a gate of the first differential transistor is coupled to a pre-stage first input terminal of the pre-stage amplifier circuit, and a gate of the second differential transistor is coupled to a pre-stage second input terminal of the pre-stage amplifier circuit, wherein the first differential transistor and the second differential transistor are configured to operably generate a differential output current according to a voltage difference between the pre-stage first input terminal and the pre-stage second input terminal; a first current mirror circuit, coupled with a drain of the second differential transistor at a differential stage output node of the pre-stage amplifier circuit, and configured to operably generate a first output current at a gain node according to the differential output current; a second current mirror circuit, configured to operably generate a second output current at the common source node according to the first output current; a third current mirror circuit, configured to operably generate a pre-stage amplified signal at a pre-stage output terminal of the pre-stage amplifier circuit according to the first output current, wherein the first current mirror circuit, the second differential transistor and the second current mirror circuit form a positive potential feedback (PPFB) loop; and at least one feedback capacitor, coupled between a pre-stage third input terminal of the pre-stage amplifier circuit and at least one inverting node of the pre-stage amplifier circuit, wherein on a signal feedforward path, a voltage of each of the inverting nodes has an inverting relationship with a voltage of the amplifying output node; wherein one of the pre-stage first input terminal and the pre-stage second input terminal of each pre-stage amplifier circuit receives the first input signal, and the other one receives the second input signal, and the pre-stage third input terminal is coupled to the amplifying output node, and the pre-stage output terminal is coupled to the driving node, and the pre-stage amplified signal corresponds to the error amplified signal; wherein when a transient signal occurs at the amplifying output node, an acceleration signal is generated at the corresponding inverting node through the at least one feedback capacitor, to accelerate the transient response of the output signal.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 2:
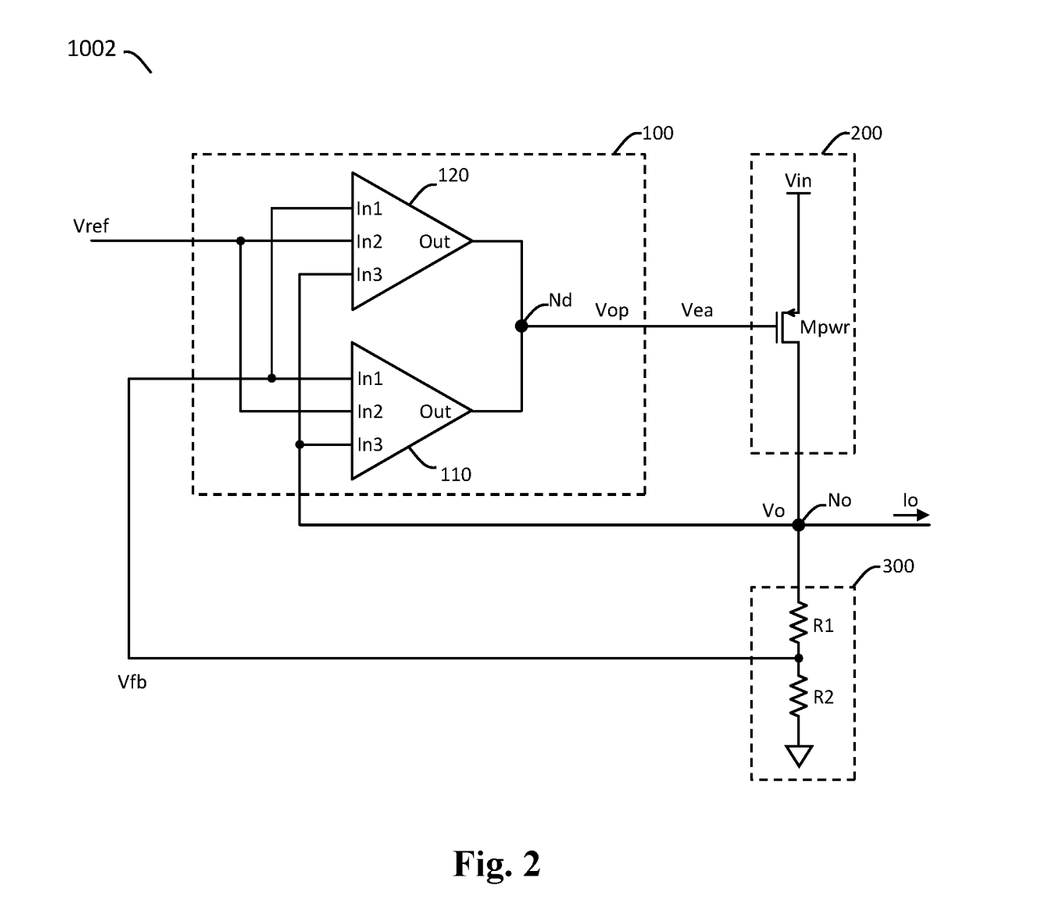
FIG. 2 shows a schematic block diagram of a linear regulator circuit having fast transient response according to an embodiment of the present invention.

FIG. 2 shows a schematic block diagram of a linear regulator circuit having fast transient response according to an embodiment of the present invention (linear regulator circuit 1002). As shown in FIG. 2, in this embodiment, the linear regulator circuit 1002 includes an error amplifier circuit 100, an output stage circuit 200 and a regulation feedback circuit 300. The error amplifier circuit 100 is configured to operably amplify a difference between a feedback signal Vfb and a reference signal Vref to generate an error amplified signal Vea at a driving node Nd. The output stage circuit 200 includes at least one output power switch Mpwr which is controlled by the error amplified signal Vea to convert an input power Vin to an output signal Vo at an amplifying output node No. The regulation feedback circuit 300 is configured to operably generate the feedback signal Vfb according to the output signal Vo. In one embodiment, as shown in FIG. 2, the regulation feedback circuit 300 can be implemented as a voltage divider circuit (e.g. consisting of resistor R1 and resistor R2 in FIG. 2) to divide the output signal Vo to generate the feedback signal Vfb. In one embodiment, ratio between the feedback signal Vfb and the output signal Vo is larger than 0 and smaller than or equal to 1.

In one embodiment, the linear regulator circuit having fast transient response of the present invention can be implemented as a Low Drop-out Regulator (LDO). Still referring to FIG. 2, in one embodiment, the output power switch Mpwr is a MOS transistor. As shown in FIG. 2, in one preferred embodiment, the output power switch Mpwr is a PMOS transistor, but the present invention is not limited to this example. In other embodiments, the output power switch Mpwr can be other types of transistors, such as a BJT transistor.

Still referring to FIG. 2, in this embodiment, the output power switch Mpwr has a first terminal (e.g. corresponding to a source), a second terminal (e.g. corresponding to a drain) and a control terminal (e.g. corresponding to a gate), wherein the source of the output power switch Mpwr is coupled to the input power Vin, and the drain of the output power switch Mpwr is coupled to the output signal Vo, and the gate of the output power switch Mpwr is coupled to the error amplified signal Vea, so that the output power switch Mpwr is configured to operably convert the input power Vin to the output signal Vo. From one perspective, a voltage difference between the control terminal of the output power switch Mpwr and the first terminal of the output power switch Mpwr (e.g. corresponding to a gate-source voltage of the output power switch Mpwr) determines the conduction level of the output power switch Mpwr.

Figure 3:
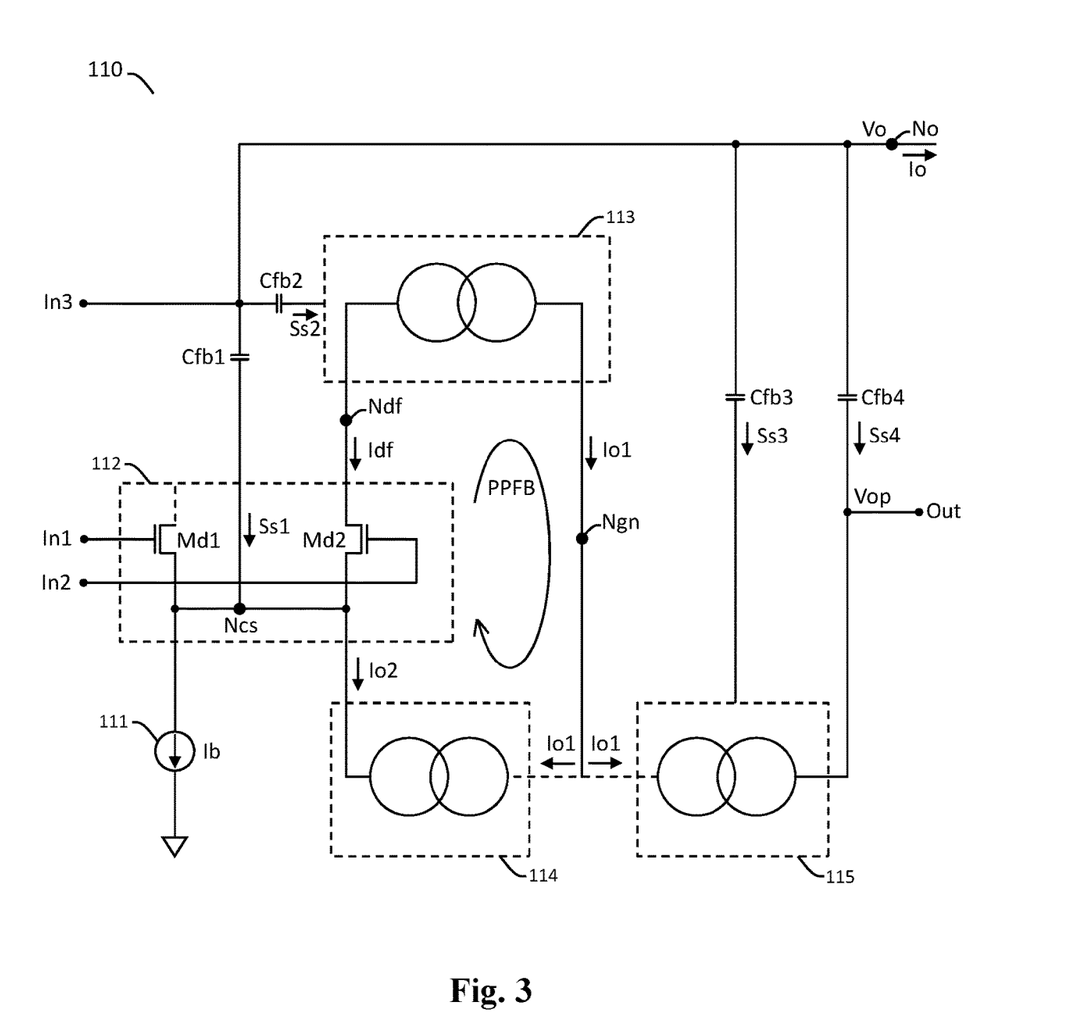
FIG. 3 shows an embodiment of a pre-stage amplifier circuit in the linear regulator circuit having fast transient response according to the present invention.

Still referring to FIG. 2, the error amplifier circuit 100 includes at least one pre-stage amplifier circuit. For example, in this embodiment, the error amplifier circuit 100 includes a first pre-stage amplifier circuit 110 and a second pre-stage amplifier circuit 120. Please refer to FIG. 3 together with FIG. 2, FIG. 3 shows an embodiment of a pre-stage amplifier circuit (pre-stage amplifier circuit 110) in the linear regulator circuit having fast transient response according to the present invention. As shown in FIG. 3, in this embodiment, the pre-stage amplifier circuit 110 includes a current source circuit 111, a differential input circuit 112, a first current mirror circuit 113, a second current mirror circuit 114 and a third current mirror circuit 115.

Still referring to FIG. 3, the current source circuit 111 is configured to operably provide a bias current Ib at (i.e., in this embodiment, to draw a bias current Ib from) a common source node Ncs of the pre-stage amplifier circuit 110. The differential input circuit 112 includes a first differential transistor Md1 and a second differential transistor Md2, wherein a source of the first differential transistor Md1 and a source of the second differential transistor Md2 are coupled together at the common source node Ncs. A gate of the first differential transistor Md1 is coupled to a pre-stage first input terminal In1 of the pre-stage amplifier circuit 110, and a gate of the second differential transistor Md2 is coupled to a pre-stage second input terminal In2 of the pre-stage amplifier circuit 110. The first differential transistor Md1 and the second differential transistor Md2 are configured to operably generate a differential output current Idf at a differential stage output node Ndf according to a voltage difference between the pre-stage first input terminal In1 and the pre-stage second input terminal In2.

The first current mirror circuit 113 is coupled with a drain of the second differential transistor Md2 at a differential stage output node Ndf, and the first current mirror circuit 113 is configured to operably generate a first output current Io1 at a gain node Ngn according to the differential output current Idf. The second current mirror circuit 114 is configured to operably generate a second output current Io2 at the common source node Ncs according to the first output current Io1. The third current mirror circuit 115 is configured to operably generate a pre-stage amplified signal Vop at a pre-stage output terminal Out according to the first output current Io1.

According to the present invention, the first current mirror circuit 113, the second differential transistor Md2 and the second current mirror circuit 114 form a positive potential feedback (PPFB) loop, and in one embodiment, the PPFB loop has at least one steady state. In one embodiment, when the output signal Vo is in a quiescent state, the PPFB loop has a steady-state current which is related to the bias current Ib; on the other hand, when the output signal Vo is in a transient state (i.e. when there is a transient change at the amplifying output node No), the transient change of the current on the PPFB loop is related to the switching speed of a load; thus, the power conversion can be achieved with high efficiency. The transient change can occur in any form at the amplifying output node No, including but not limited to the form of a voltage signal or a current signal; in other words, the transient change includes a variation of the output signal Vo or an output current (load current) Io due to the switching of the load. From another perspective, when the output signal Vo is in a transient state, the PPFB loop has a transient current which is not related to the bias current Ib; more specifically, the transient current in this situation can be many-fold of the bias current Ib (e.g. several times to several hundred times or more), whereby the power conversion can be achieved with high efficiency. In one embodiment, the PPFB loop has a loop gain which is less than 1, so that the PPFB loop can still be stable while it provides the transient current which is much more than the bias current Ib to reach high efficiency.

Note that the "efficiency" mentioned above refers to a ratio of an operable maximum transient current to the quiescent current, and the larger the ratio is, the higher the efficiency is. Besides, the "positive potential feedback (PPFB) loop" mentioned above means that when a voltage change occurs at any node on the PPFB loop, the whole PPFB loop will feedback a positive change to the voltage at the node. Note that because of the configuration of positive feedback, the current difference between the differential pair (i.e. transistor Md1 and Md2) is not limited by the bias current Ib. In other words, at a predetermined bias current Ib, the current difference between the differential pair can reach several times to several hundred times because of the configuration of positive feedback, so that the power conversion can be achieved with high efficiency. In one preferred embodiment, the bias current Ib can be choosen to be a small current, such that each transistor in the pre-stage amplifier circuit can operate in a subthreshold region in a quiescent state.

Still referring to FIG. 3, according to the present invention, each pre-stage amplifier circuit (e.g. the pre-stage amplifier circuit 110 in FIG. 3) further includes at least one feedback capacitor which is coupled between a pre-stage third input terminal In3 of the pre-stage amplifier circuit 110 and at least one inverting node of the pre-stage amplifier circuit 110. The "inverting node" means that on a signal amplifying path, there is an inverting relation between a voltage at the inverting node and a voltage at the amplifying output node No. In other words, on a signal amplifying path, when the voltage at the inverting node changes, the voltage at the amplifying output node No changes in an opposite way. From one perspective, the "signal amplifying path" is a signal feedforward path. The specific embodiments of the "inverting node" and the "signal amplifying path" will be described in detail later.

Please refer to FIG. 2 together with FIG. 3. In one embodiment, the pre-stage first input terminal In1 of each pre-stage amplifier circuit (e.g. pre-stage amplifier circuit 110 or 120) is coupled to the feedback signal Vfb; the pre-stage second input terminal In2 of each pre-stage amplifier circuit is coupled to the reference signal Vref; the pre-stage third input terminal In3 of each pre-stage amplifier circuit is coupled to the amplifying output node No; the pre-stage output terminal Out of each pre-stage amplifier circuit is coupled to the driving node Nd; and the pre-stage amplified signal Vop corresponds to the error amplified signal Vea.

It is noteworthy that, the above coupling arrangements of the pre-stage amplifier circuits are non-limiting examples; especially, the coupling relation between the pre-stage first input terminal In1 and the pre-stage second input terminal In2 can be determined according to the conductive type of the output power switch Mpwr or the overall feedback relation. For example, when the output power switch Mpwr is implemented as an NMOS transistor, the pre-stage first input terminal In1 is coupled to the reference signal Vref, and the pre-stage second input terminal In2 is coupled to the feedback signal Vfb. In this case, the "inverting node" mentioned above should be correspondingly arranged, as one skilled in this art readily understands under the teaching of the present invention.

Besides, in an embodiment wherein the error amplifier circuit 100 includes only one pre-stage amplifier circuit, the pre-stage amplifier circuit 120 in FIG. 2 can be replaced by a pre-stage load circuit, which operates simply as a load of the pre-stage amplifier circuit 110 to generate the pre-stage amplified signal Vop.

Still referring to FIG. 3, in one embodiment, the at least one feedback capacitor includes a first feedback capacitor Cfb1 which is coupled between the pre-stage third input terminal In3 (corresponding to the amplifying output node No) and an inverting node on the PPFB loop. In one preferred embodiment, as shown in FIG. 3, the first feedback capacitor Cfb1 is coupled between the pre-stage third input terminal In3 and the common source node Ncs, whereby when a transient signal occurs at the pre-stage third input terminal In3, a first acceleration signal Ss1 is generated at the common source node Ncs through the first feedback capacitor Cfb1 to accelerate the transient response of the current on the PPFB loop, which accelerates the transient response of the pre-stage amplified signal Vop and the output signal Vo.

More specifically, for example, when the load current Io has a step transient or an pulse transient (transient in a step form or a pulse form), the AC component of the load current transient will charge or discharge the common source node Ncs in high speed and high energy (in pulse form) through the first feedback capacitor Cfb1, such that the gate-source voltage of the second differential transistor Md2 changes rapidly, which can accelerate the transient response of the current on the PPFB loop, whereby the transient response of the pre-stage amplified signal Vop and the output signal Vo are accelerated. Note that the first acceleration signal Ss1 which is generated at the common source node Ncs through the first feedback capacitor Cfb1 is in direct response to the transient of the load current Io, so its acceleration ability to the transient current on the PPFB loop is much greater than the response speed of the feedback signal Vfb (corresponding to the pre-stage first input terminal In1, i.e., through the first differential transistor Md1). Thus, compared to a situation without the first feedback capacitor Cfb1, under the premise of the high efficiency requirement mentioned above (i.e. at a low bias current Ib), the embodiment with the first feedback capacitor Cfb1 can significantly accelerate the transient response of the linear regulator circuit of the present invention. Note that the transient current on the PPFB loop refers to a transient current change during a short interval when the gate-source voltage difference between the first differential transistor Md1 and the second differential transistor Md2 is not balanced (e.g. when they have not been virtually shorted by loop feedback). When the gate-source voltage of the first differential transistor Md1 is equal to the gate-source voltage of the second differential transistor Md2 (e.g. when the gate voltages of the first differential transistor Md1 and the second differential transistor Md2 are virtually shorted because of feedback), the PPFB loop will enter to a steady state determined by the bias current Ib.

Figure 4:
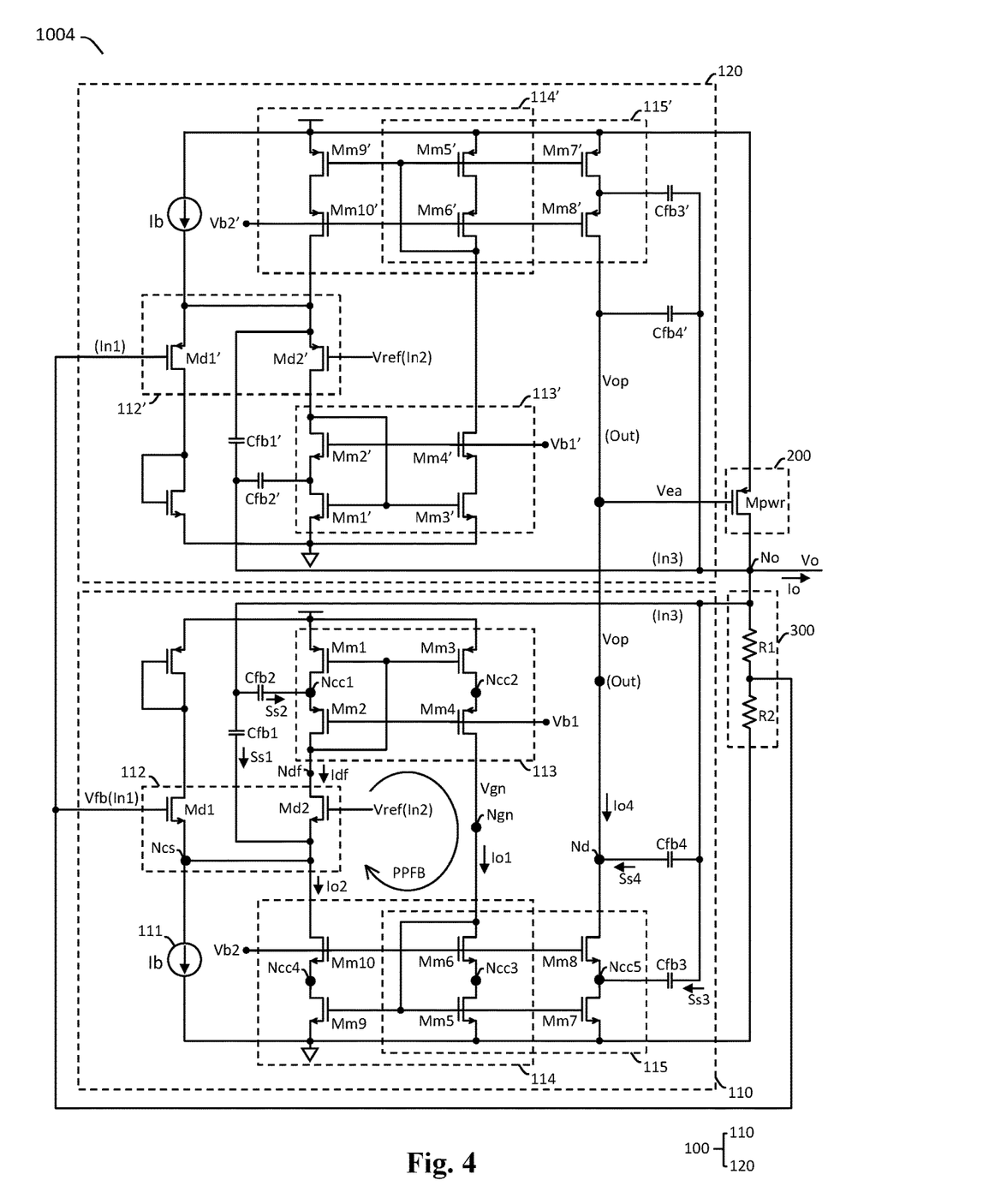
FIG. 4 shows a specific embodiment of a linear regulator circuit having fast transient response and a pre-stage amplifier circuit according to the present invention.

FIG. 4 shows a specific embodiment of a linear regulator circuit having fast transient response and a pre-stage amplifier circuit according to the present invention (linear regulator circuit 1004 and pre-stage amplifier circuits 110 and 120). For simplicity, the description will focus on the pre-stage amplifier circuit 110, but the same spirit applies to the pre-stage amplifier circuit 120. In one embodiment, the first current mirror circuit 113 is implemented as a cascoded current mirror circuit. In one embodiment, the at least one feedback capacitor further includes a second feedback capacitor Cfb2 which is coupled between the pre-stage third input terminal In3 of the pre-stage amplifier circuit 110 (corresponding to the amplifying output node No) and a current input cascode node Ncc1 of the first current mirror circuit 113, whereby when a transient signal occurs at the pre-stage third input terminal In3, a second acceleration signal Ss2 is generated at the current input cascode node Ncc1. Note that the first acceleration signal Ss1 and the second acceleration signal Ss2 are configured to operate in a push-pull manner to accelerate the transient current on the PPFB loop; the details thereof will be described below. Note that the "current input cascode node" is a node where plural cascode transistors on a current input path of the cascoded current mirror circuit (e.g. the first current mirror circuit 113) are coupled together.

Specifically, when the load current Io increases rapidly, the first acceleration signal Ss1 and the second acceleration signal Ss2 will be simultaneously generated respectively at the common source node Ncs and the current input cascode node Ncc1, wherein the first acceleration signal Ss1 and the second acceleration signal Ss2 are in phase. In this embodiment, the common source node Ncs and the current input cascode node Ncc1 are respectively coupled to the source of the second differential transistor Md2 and a source of a second cascode transistor Mm2. In this embodiment, the second differential transistor Md2 and the second cascode transistor Mm2 have different conductive type, so that changes of the first acceleration signal Ss1 and the second acceleration signal Ss2 in the same phase cause transconduction response in inverted-phase of the second differential transistor Md2 and the second cascode transistor Mm2, which accelerate the transient response in a push-pull manner. The conductive types of the transistors in the present invention will be described below.

Still referring to FIG. 4, more specifically, the first current mirror circuit 113 includes a first cascode transistor Mm1, a second cascode transistor Mm2, a third cascode transistor Mm3 and a fourth cascode transistor Mm4. The first cascode transistor Mm1 and the second cascode transistor Mm2 are on the current input path and are coupled in series between the differential stage output node Ndf and a power source. The first cascode transistor Mm1 and the second cascode transistor Mm2 are configured to operably receive the differential output current Idf, wherein the first cascode transistor Mm1 and the second cascode transistor Mm2 are cascoded at the current input cascode node Ncc1. The third cascode transistor Mm3 and fourth cascode transistor Mm4 are on the current output path and are coupled in series between the gain node Ngn and the power source. The third cascode transistor Mm3 and fourth cascode transistor Mm4 are configured to operably mirror the differential output current Idf to generate the first output current Io1, wherein the third cascode transistor Mm3 and the fourth cascode transistor Mm4 are cascoded at a current output cascode node Ncc2. A gate of the first cascode transistor Mm1 and a gate of the third cascode transistor Mm3 are coupled to the differential stage output node Ndf, and a gate of the second cascode transistor Mm2 and a gate of the fourth cascode transistor Mm4 are coupled to a first bias voltage Vb1.

From one perspective, the first cascode transistor Mm1 and the second cascode transistor Mm2 form diode connection to receive the differential output current Idf, wherein the second cascode transistor Mm2 increases an output resistance of the first cascode transistor Mm1 by the cascoded configuration; the third cascode transistor Mm3 mirrors a current of the first cascode transistor Mm1; and the fourth cascode transistor Mm4 increases an output resistance of the third cascode transistor Mm3 by the cascoded configuration.

Still referring to FIG. 4, in this embodiment, the common source node Ncs and the current input cascode node Ncc1 are two specific embodiments of the "inverting node" mentioned above. On the signal amplifying path, when a voltage at the "inverting node" (e.g. the common source node Ncs and the current input cascode node Ncc1) fluctuates, a voltage at the amplifying output node No changes in an opposite direction. Specifically, the "signal amplifying path" in this embodiment is for example a signal path through the transistors Md2, Mm2, Mm1, Mm3, Mm4, Mm6, Mm5, Mm7, Mm8 and Mpwr, by amplifying or converting or buffering a signal, to generate the output signal Vo at the amplifying output node No. From one perspective, the "signal amplifying path" is a path on which an input signal of an amplifier circuit feeds forward to an output signal.

From another perspective, there is feedback from the output signal Vo to the first feedback capacitor Cfb1 and the second feedback capacitor Cfb2, to generate the first acceleration signal Ss1 and the second acceleration signal Ss2. The first acceleration signal Ss1 and the second acceleration signal Ss2 are in the same phase with the output signal Vo and the load current Io. For example, when the load current Io draws a transient current from the amplifying output node No (i.e. the load current Io has a transient increase), the first feedback capacitor Cfb1 and the second feedback capacitor Cfb2 simultaneously draw a transient current in proportional to the transient increase from the inverting node (i.e. the common source node Ncs and the current input cascode node Ncc1), to accelerate the transient response of the output signal Vo (therefore, the first acceleration signal Ss1 and the second acceleration signal Ss2 which are in the same phase with the load current Io can be regarded as high frequency feedback currents).

Still referring to FIG. 4, in one embodiment, the third current mirror circuit 115 is implemented as a cascoded current mirror circuit. In this embodiment, the at least one feedback capacitor includes a third feedback capacitor Cfb3 which is coupled between the pre-stage third input terminal In3 (corresponding to the amplifying output node No) and a current output cascode node Ncc5 of the third current mirror circuit 115, whereby when a transient signal occurs at the pre-stage third input terminal In3, a third acceleration signal Ss3 is generated at the current output cascode node Ncc5 through the third feedback capacitor Cfb3 to accelerate the transient response of the output signal Vo. Note that the "current output cascode node" is a node where plural cascode transistors on a current output path of a cascoded current mirror circuit (e.g. the third current mirror circuit 115) are coupled together.

Still referring to FIG. 4, more specifically, in this embodiment, the third current mirror circuit 115 includes a fifth cascode transistor Mm5, a sixth cascode transistor Mm6, a seventh cascode transistor Mm7 and an eighth cascode transistor Mm8. The fifth cascode transistor Mm5 and sixth cascode transistor Mm6 are on the current input path, and are coupled in series between the gain node Ngn and a ground. The fifth cascode transistor Mm5 and sixth cascode transistor Mm6 are configured to operably receive the first output current Io1, wherein the fifth cascode transistor Mm5 and the sixth cascode transistor Mm6 are cascoded at a current input cascode node Ncc3. The seventh cascode transistor Mm7 and eighth cascode transistor Mm8 on the current output path are coupled in series between the driving node Nd and the ground, and configured to operably mirror the first output current Io1 to generate a fourth output current Io4 at the pre-stage output terminal Out, for generating the pre-stage amplified signal Vop, wherein the seventh cascode transistor Mm7 and the eighth cascode transistor Mm8 are cascoded at the current output cascode node Ncc5. A gate of the fifth cascode transistor Mm5 and a gate of the seventh cascode transistor Mm7 are coupled to the gain node Ngn, and a gate of the sixth cascode transistor Mm6 and a gate of the eighth cascode transistor Mm8 are coupled to a second bias voltage Vb2. The sixth cascode transistor Mm6 and the eighth cascode transistor Mm8 respectively increase an output resistance of the fifth cascode transistor Mm5 and an output resistance of the seventh cascode transistor Mm7 by the cascoded configuration.

Still referring to FIG. 4, in one embodiment, the at least one feedback capacitor includes a fourth feedback capacitor Cfb4 which is coupled between the pre-stage third input terminal In3 (corresponding to the amplifying output node No) and the driving node Nd, whereby when a transient signal occurs at the pre-stage third input terminal In3, a fourth acceleration signal Ss4 is generated at the driving node Nd through the fourth feedback capacitor Cfb4 to accelerate the transient response of the output signal Vo.

Note that in other embodiments, the circuit can include only one or a combination of two or more of the first to the fourth feedback capacitors Cfb1-Cfb4, and each such embodiment has fast transient response ability.

Still referring to FIG. 4, in one embodiment, the first differential transistor Md1 and the second differential transistor Md2 are both first conductive type transistors, and the first, second, third and fourth cascode transistors Mm1-Mm4 are all second conductive type transistors, and the fifth, sixth, seventh and eighth cascode transistors Mm5-Mm8 are all first conductive type transistors. Take the pre-stage amplifier circuit 110 in FIG. 4 for example, in one embodiment, the first conductive type transistors are N-type transistors (NMOS), and the second conductive type transistors are P-type transistors (PMOS).

Still referring to FIG. 4, in one embodiment, the second current mirror circuit 114 is implemented as a cascoded current mirror circuit. Specifically, in this embodiment, the second current mirror circuit 114 includes the fifth cascode transistor Mm5, the sixth cascode transistor Mm6, a ninth cascode transistor Mm9 and a tenth cascode transistor Mm10. The ninth cascode transistor Mm9 and the tenth cascode transistor Mm10 are coupled in series between the common source node Ncs and the ground, and configured to operably generate the second output current Io2. The gate of the fifth cascode transistor Mm5 and a gate of the ninth cascode transistor Mm9 are coupled to the gain node Ngn, and the gate of the sixth cascode transistor Mm6 and a gate of the tenth cascode transistor Mm10 are coupled to the second bias voltage Vb2. In one embodiment, the ninth cascode transistor Mm9 and the tenth cascode transistor Mm10 are both first conductive type transistors, and they are cascoded at a current output cascode node Ncc4.

Please refer to FIGS. 2-4. In one embodiment, the at least one pre-stage amplifier circuit includes a first pre-stage amplifier circuit 110 and a second pre-stage amplifier circuit 120, wherein the first pre-stage amplifier circuit 110 and the second pre-stage amplifier circuit 120 are in complementary configuration. Take FIG. 4 for example, the first conductive type in the first pre-stage amplifier circuit 110 is N-type and the second conductive type in the first pre-stage amplifier circuit 110 is P-type, while the first conductive type in the second pre-stage amplifier circuit 120 is P-type and the second conductive type in the second pre-stage amplifier circuit 120 is N-type. Besides, the power sources, grounds and the directions of the currents in the first pre-stage amplifier circuit 110 and in the second pre-stage amplifier circuit 120 are in complementary configuration, to enhance the push-pull operation at the driving node Nd to generate the pre-stage amplified signal Vop.

More specifically, in the second pre-stage amplifier circuit 120 in FIG. 4, a differential input circuit 112', a first current mirror circuit 113', a second current mirror circuit 114' and a third current mirror circuit 115' respectively correspond to the differential input circuit 112, the first current mirror circuit 113, the second current mirror circuit 114 and the third current mirror circuit 115. Cascode transistors Mm1'-Mm10' are respectively in complementary correspondence to the cascode transistors Mm1-Mm10 in the first pre-stage amplifier circuit 110. For example, in this embodiment, the cascode transistors Mm1'-Mm4' are N-type transistors, the cascode transistors Mm5'-Mm10' are P-type transistors, and the differential transistor Md1 and Md2 are P-type transistors. The bias voltage Vb2' is in complementary correspondence to the bias voltage Vb2. Note that in an embodiment wherein the feedback capacitors Cfb1'-Cfb4' are made of semiconductor devices (e.g. using MOS capacitors or MOS transistors as the feedback capacitors), the feedback capacitors Cfb1'-Cfb4' are in complementary correspondence to the feedback capacitors Cfb1-Cfb4, i.e., the feedback capacitors Cfb1'-Cfb4' and Cfb1-Cfb4 have complementary conductive types. On the other hand, it is not limited to the above when the feedback capacitors are made of semiconductor devices.

Figure 5:
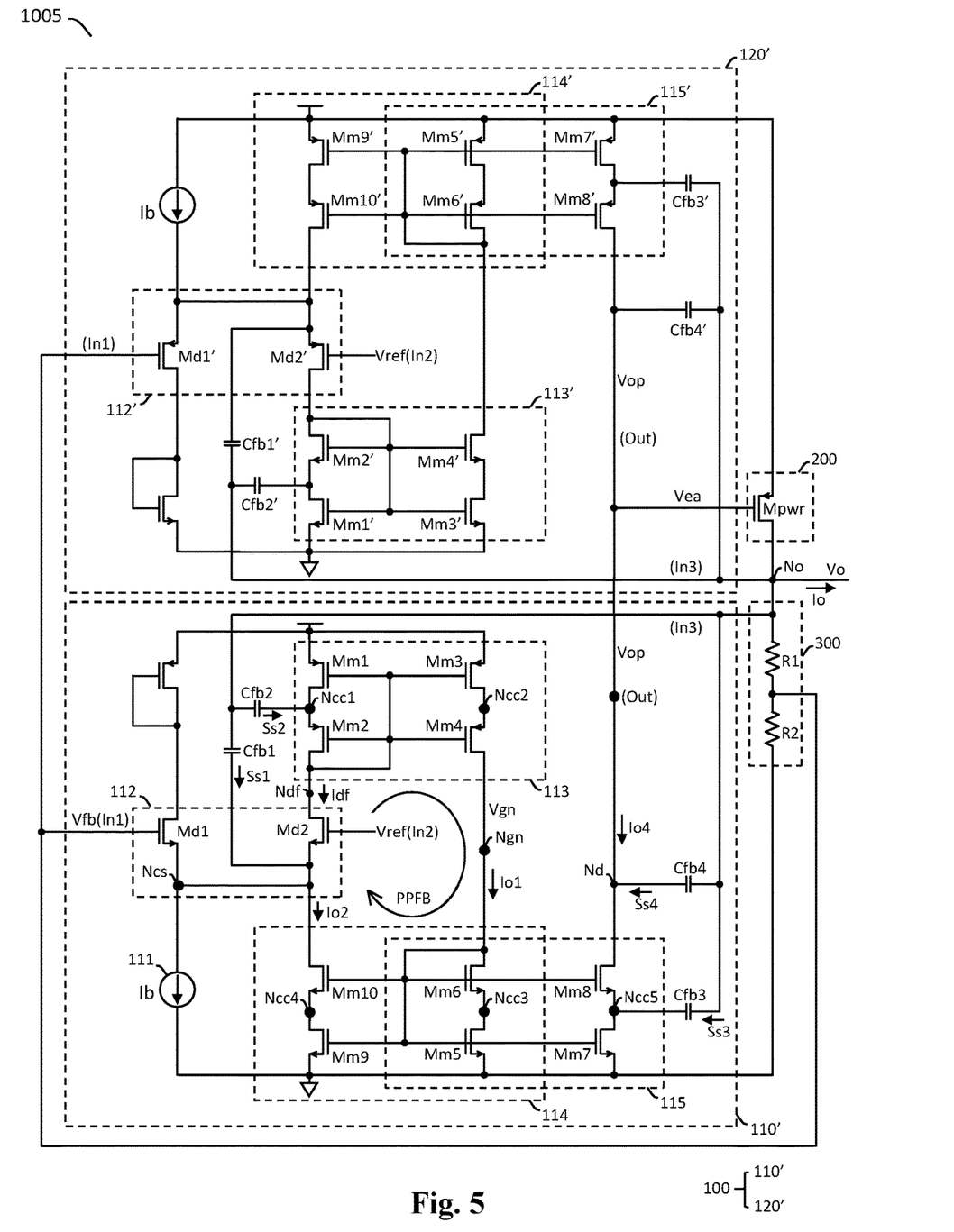
FIG. 5 shows a specific embodiment of a linear regulator circuit having fast transient response and a pre-stage amplifier circuit according to the present invention.

Please refer to FIG. 5. FIG. 5 shows a specific embodiment of a linear regulator circuit having fast transient response and a pre-stage amplifier circuit according to the present invention (linear regulator circuit 1005 and pre-stage amplifier circuits 110' and 120'). In one embodiment, the gate of the second cascode transistor Mm2 and the gate of the fourth cascode transistor Mm4 are coupled to the differential stage output node Ndf, wherein the absolute values of the conduction threshold voltages of the second cascode transistor Mm2 and the fourth cascode transistor Mm4 are less than the absolute values of the conduction threshold voltages of the first cascode transistor Mm1 and the third cascode transistor Mm3. For example, the first cascode transistor Mm1 and the third cascode transistor Mm3 can be enhancement mode transistors, and the second cascode transistor Mm2 and the fourth cascode transistor Mm4 can be depletion mode transistors or native transistors. Note that in the above configuration, the cascode transistors Mm1-Mm4 can still achieve the current mirror function with amplified output resistance by the cascoded configuration.

Still referring to FIG. 5, in one embodiment, the gates of the sixth, the eighth and the tenth cascode transistors Mm6, Mm8 and Mm10 are coupled to the gain node Ngn, wherein the absolute values of the conduction threshold voltages of the sixth, the eighth and the tenth cascode transistors Mm6, Mm8 and Mm10 are less than the absolute values of the conduction threshold voltages of the fifth, the seventh and the ninth cascode transistors Mm5, Mm7 and Mm9.

Figure 6:
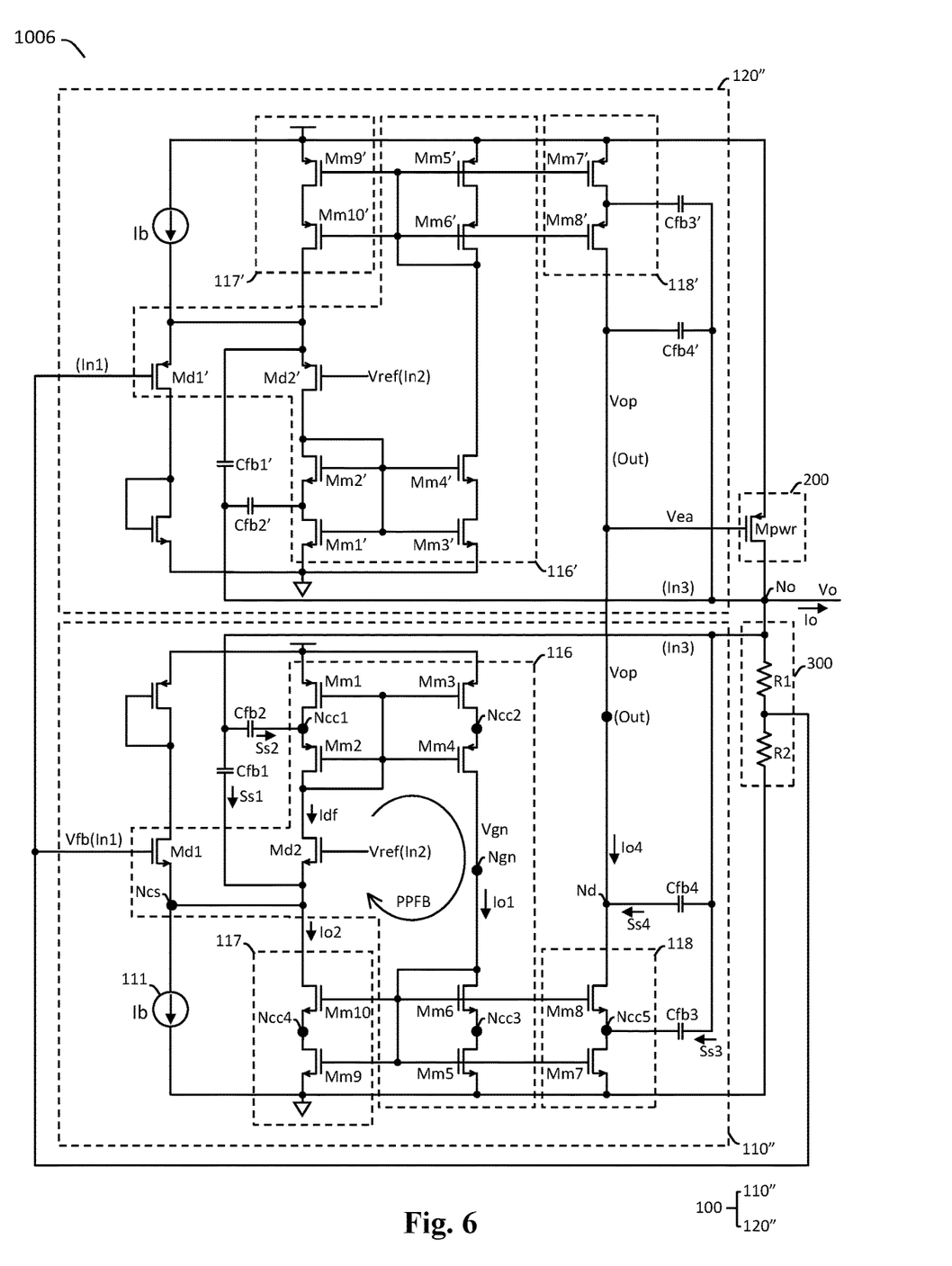
FIG. 6 shows a specific embodiment of a linear regulator circuit having fast transient response and a pre-stage amplifier circuit according to the present invention.

Please refer to FIG. 6. FIG. 6 shows a specific embodiment of a linear regulator circuit having fast transient response and a pre-stage amplifier circuit according to the present invention (linear regulator circuit 1006 and pre-stage amplifier circuit 110" and 120"). From another perspective, a linear regulator circuit having fast transient response can correspond to another configuration such as the linear regulator circuit 1006 in FIG. 6. As shown in FIG. 6, in one embodiment, a pre-stage amplifier circuit (e.g. 110") of the linear regulator circuit 1006 includes a current source circuit 111, a differential gain circuit 116, a first transconductor circuit 117, a second transconductor circuit 118 and at least one feedback capacitor.

Still referring to FIG. 6, in one embodiment, the current source circuit 111 is configured to operably provide a bias current Ib at a common source node Ncs of the pre-stage amplifier circuit 110". The differential gain stage circuit 116 is configured to operably generate a gain output voltage Vgn of a gain node Ngn according to a voltage difference between a pre-stage first input terminal In1 and a pre-stage second input terminal In2. The first transconductor circuit 117 is configured to operably generate a feedback current (corresponding to the second current Io2 which can be regarded as a low-frequency feedback current) at the common source node Ncs according to the gain output voltage Vgn. The second transconductor circuit 118 is configured to operably generate a fourth output current Io4 according to the gain output voltage Vgn, for generating the pre-stage amplified signal Vop at a pre-stage output terminal Out of the pre-stage amplifier circuit 110". In this embodiment, the differential gain stage circuit 116 and the first transconductor circuit 117 form a positive potential feedback (PPFB) loop. In this embodiment, the pre-stage amplifier circuit 110" further includes at least one feedback capacitor which is coupled between a pre-stage third input terminal In3 of the pre-stage amplifier circuit 110" and at least one inverting node of the pre-stage amplifier circuit 110".

Still referring to FIG. 6, in one embodiment, the at least one feedback capacitor of each pre-stage amplifier circuit includes a first feedback capacitor Cfb1 which is coupled between the pre-stage third input terminal In3 and an inverting node on the PPFB loop. In one preferred embodiment, the first feedback capacitor Cfb1 is coupled between the pre-stage third input terminal In3 and the common source node Ncs, whereby when a transient signal occurs at the pre-stage third input terminal In3, a first acceleration signal Ss1 is generated at the common source node Ncs through the first feedback capacitor Cfb1 to accelerate the transient response of the current on the PPFB loop.

Note that in this embodiment, the differential gain stage circuit and the transconductor circuit are not limited to the differential gain stage circuit 116 and the transconductor circuits 117 and 118 mentioned above; they can be replaced by other types of differential gain stage circuits and transconductor circuits as long as a PPFB loop is formed and at least one feedback capacitor is coupled between the pre-stage third input terminal In3 and the common source node Ncs.

Figure 7:
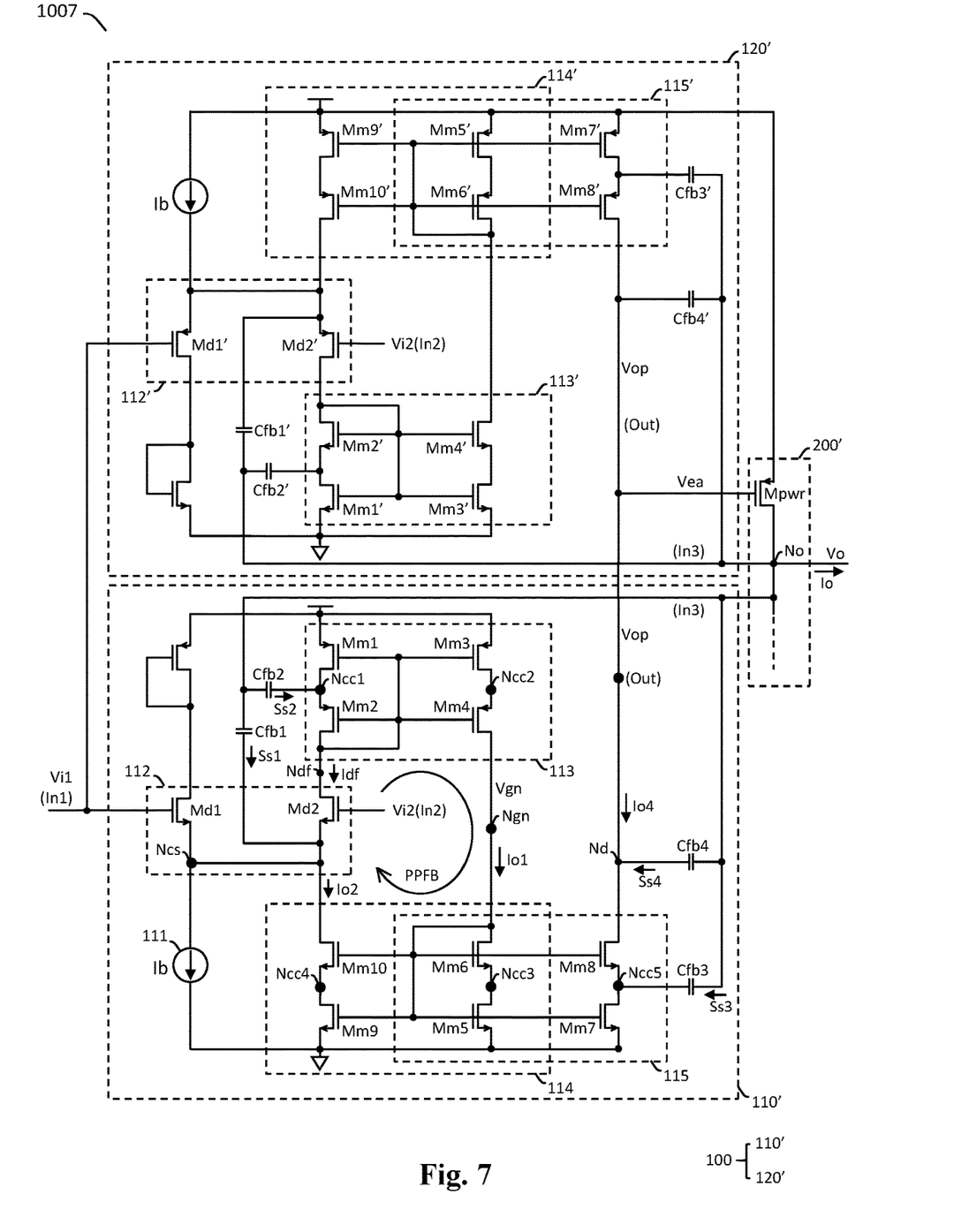
FIG. 7 shows an embodiment of a signal amplifier circuit having fast transient response according to the present invention.

Please refer to FIG. 7. FIG. 7 shows an embodiment of a signal amplifier circuit having fast transient response according to the present invention (signal amplifier circuit 1007). The error amplifier circuits and the pre-stage amplifier circuits mentioned above can form a general-purpose signal amplifier circuit (such as the signal amplifier circuit 1007). In this embodiment, the signal amplifier circuit 1007 comprises an error amplifier circuit 100 and an output stage circuit 200'. The error amplifier circuit 100 is configured to operably amplify a voltage difference between a first input signal Vi1 and a second input signal Vi2 to generate an error amplified signal Vea at a driving node Nd. The output stage circuit 200' includes at least one output power switch Mpwr which is controlled by the error amplified signal Vea to generate an output signal Vo at an amplifying output node No. the circuit configurations to achieve high efficiency and fast transient response of the previous embodiments are all applicable to the error amplifier circuit 100 of this embodiment. Besides, the output stage circuit 200' can be any type of output stage circuit as required.

Figure 8:
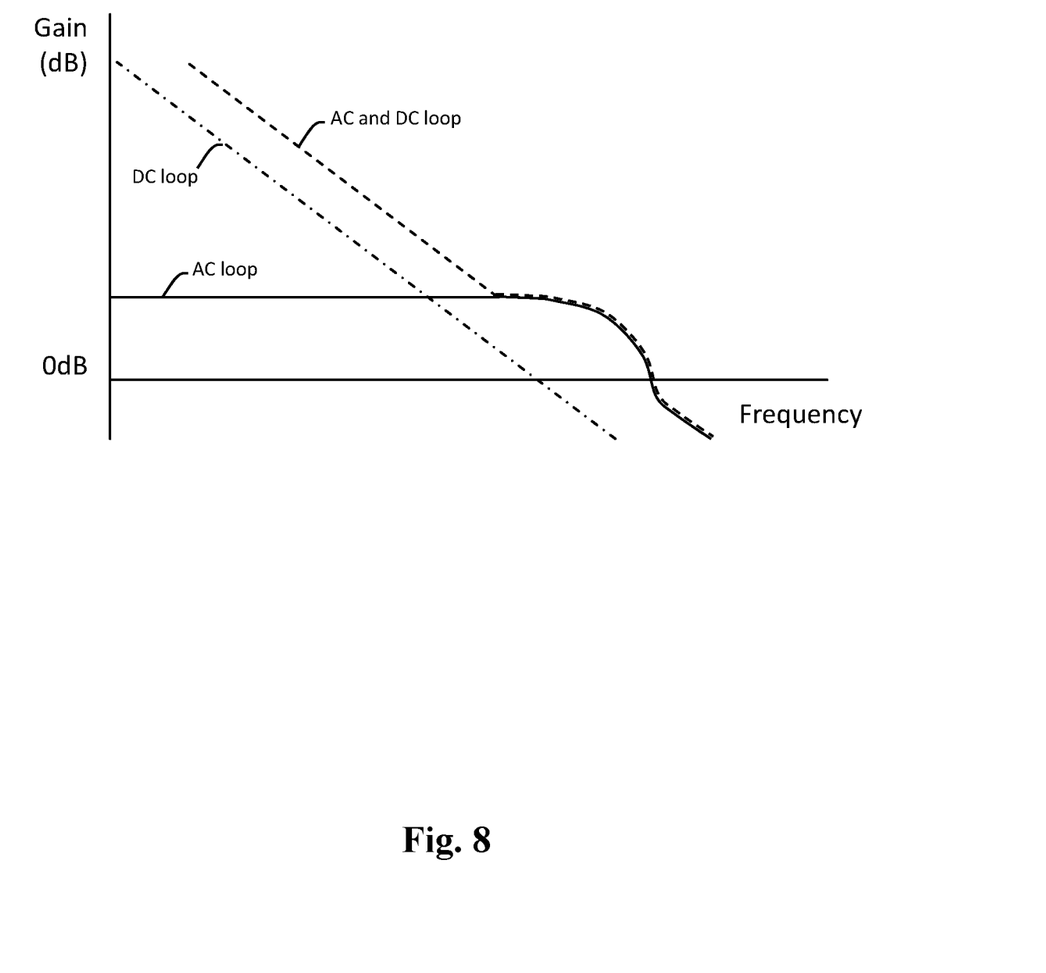
FIG. 8 shows a frequency response characteristic diagram corresponding to a linear regulator circuit having fast transient response in the present invention.

Please refer to FIG. 8. FIG. 8 shows a frequency response characteristic diagram corresponding to a linear regulator circuit having fast transient response of the present invention. It is noteworthy that the bandwidth of a linear regulator circuit having fast transient response of the present invention (as shown by the "AC and DC loop" in FIG. 8) can be 30 times larger than that of the prior art (as shown by the "DC loop" in FIG. 8) because the DC signal and the acceleration signal (AC signal) in the present invention both feed back to the same node (e.g. the common source node Ncs or the current input cascode node Ncc1). As a result, the present invention can achieve fast transient response, and because there are DC and AC operations in the loop, there is high low-frequency gain, and the output voltage error is small.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A linear regulator circuit having fast transient response, comprising:
   an error amplifier circuit, configured to operably amplify a difference between a feedback signal and a reference signal to generate an error amplified signal at a driving node;
   an output stage circuit, including at least one output power switch which is controlled by the error amplified signal to generate an output signal at an amplifying output node; and
   a regulation feedback circuit, configured to operably generate the feedback signal according to the output signal;
   wherein the error amplifier circuit includes:
      at least one pre-stage amplifier circuit which includes:
         a current source circuit, configured to operably provide a bias current at a common source node of the pre-stage amplifier circuit;
         a differential input circuit, including a first differential transistor and a second differential transistor, wherein a source of the first differential transistor and a source of the second differential transistor are coupled together at the common source node, and a gate of the first differential transistor is coupled to a pre-stage first input terminal of the pre-stage amplifier circuit, and a gate of the second differential transistor is coupled to a pre-stage second input terminal of the pre-stage amplifier circuit, wherein the first differential transistor and the second differential transistor are configured to operably generate a differential output current according to a voltage difference between the pre-stage first input terminal and the pre-stage second input terminal;
         a first current mirror circuit, coupled with a drain of the second differential transistor at a differential stage output node of the pre-stage amplifier circuit, and configured to operably generate a first output current at a gain node according to the differential output current;
         a second current mirror circuit, configured to operably generate a second output current at the common source node according to the first output current;
         a third current mirror circuit, configured to operably generate a pre-stage amplified signal at a pre-stage output terminal of the pre-stage amplifier circuit according to the first output current, wherein the first current mirror circuit, the second differential transistor and the second current mirror circuit form a positive potential feedback (PPFB) loop; and
         at least one feedback capacitor, coupled between a pre-stage third input terminal of the pre-stage amplifier circuit and at least one inverting node of the pre-stage amplifier circuit, wherein on a signal feedforward path, a voltage of each of the inverting nodes has an inverting relationship with a voltage of the amplifying output node;
      wherein one of the pre-stage first input terminal and the pre-stage second input terminal of each pre-stage amplifier circuit is coupled to the feedback signal, and the other one is coupled to the reference signal, and the pre-stage third input terminal is coupled to the amplifying output node, and the pre-stage output terminal is coupled to the driving node, and the pre-stage amplified signal corresponds to the error amplified signal;
      wherein when a transient signal occurs at the amplifying output node, an acceleration signal is generated at the corresponding inverting node through the at least one feedback capacitor, to accelerate the transient response of the output signal.

2. The linear regulator circuit having fast transient response of claim 1, wherein the at least one feedback capacitor of each pre-stage amplifier circuit includes a first feedback capacitor, coupled between the pre-stage third input terminal of the pre-stage amplifier circuit and an inverting node on the PPFB loop.

3. The linear regulator circuit having fast transient response of claim 2, wherein the first feedback capacitor is coupled between the pre-stage third input terminal of the corresponding pre-stage amplifier circuit and the common source node, whereby when a transient signal occurs at the pre-stage third input terminal, a first acceleration signal is generated at the common source node to accelerate a transient response of a current on the PPFB loop, whereby the transient response of the output signal is accelerated.

4. The linear regulator circuit having fast transient response of claim 3, wherein the first current mirror circuit is configured as a cascoded current mirror circuit, wherein the at least one feedback capacitor further includes a second feedback capacitor which is coupled between the pre-stage third input terminal of the pre-stage amplifier circuit and a current input cascode node of the first current mirror circuit, whereby when a transient signal occurs at the pre-stage third input terminal, a second acceleration signal is generated at the current input cascode node, wherein the first acceleration signal and the second acceleration signal are configured to operate in a push-pull manner to accelerate the transient current on the PPFB loop; wherein the current input cascode node is a node where plural cascode transistors on a current input path of the first current mirror circuit are coupled together.

5. The linear regulator circuit having fast transient response of claim 4, wherein the first current mirror circuit includes a first cascode transistor, a second cascode transistor, a third cascode transistor and a fourth cascode transistor, wherein the first cascode transistor and the second cascode transistor are cascoded at the current input cascode node to receive the differential output current, and the third cascode transistor and the fourth cascode transistor are cascoded at a current output cascode node of the first current mirror circuit to generate the first output current, wherein a gate of the first cascode transistor and a gate of the third cascode transistor are coupled to the differential stage output node, and a gate of the second cascode transistor and a gate of the fourth cascode transistor are coupled to a first bias voltage.

6. The linear regulator circuit having fast transient response of claim 5, wherein the third current mirror circuit is configured as a cascoded current mirror circuit, wherein the at least one feedback capacitor includes a third feedback capacitor which is coupled between the pre-stage third input terminal of the pre-stage amplifier circuit and a current output cascode node of the third current mirror circuit, whereby when a transient signal occurs at the pre-stage third input terminal, a third acceleration signal is generated at the current output cascode node of the third current mirror circuit to accelerate the transient response of the output signal; wherein the current output cascode node is a node on which plural cascode transistors on a current output path of the third current mirror circuit are coupled together.

7. The linear regulator circuit having fast transient response of claim 6, wherein the third current mirror circuit includes a fifth cascode transistor, a sixth cascode transistor, a seventh cascode transistor and an eighth cascode transistor, wherein the fifth cascode transistor and the sixth cascode transistor are cascoded at a current input cascode node of the third current mirror circuit to receive the first output current, and the seventh cascode transistor and the eighth cascode transistor are cascoded at the current output cascode node of the third current mirror circuit to generate a fourth output current, wherein a gate of the fifth cascode transistor and a gate of the seventh cascode transistor are coupled to the gain node, and a gate of the sixth cascode transistor and a gate of the eighth cascode transistor are coupled to a second bias voltage.

8. The linear regulator circuit having fast transient response of claim 7, wherein the at least one feedback capacitor includes a fourth feedback capacitor which is coupled between the pre-stage third input terminal of the pre-stage amplifier circuit and the driving node.

9. The linear regulator circuit having fast transient response of claim 8, wherein the first differential transistor and the second differential transistor are both first conductive type transistors, and the first, second, third and fourth cascode transistor are all second conductive type transistors, and the fifth, sixth, seventh and eighth cascode transistor are all first conductive type transistors.

10. The linear regulator circuit having fast transient response of claim 9, wherein the second current mirror circuit is configured as a cascoded current mirror circuit, including the fifth cascode transistor, the sixth cascode transistor, a ninth cascode transistor and a tenth cascode transistor, wherein the ninth cascode transistor and the tenth cascode transistor are cascoded at a current output cascode node of the second current circuit to generate the second output current at the common source node, and the gate of the fifth cascode transistor and a gate of the ninth cascode transistor are coupled to the gain node, and the gate of the sixth cascode transistor and a gate of the tenth cascode transistor are coupled to the second bias voltage.

11. The linear regulator circuit having fast transient response of claim 5, wherein the gate of the second cascode transistor and the gate of the fourth cascode transistor are coupled to the differential output node, wherein a voltage of the differential output node corresponds to the first bias voltage, wherein absolute values of conduction threshold voltages of the second cascode transistor and the fourth cascode transistor are smaller than absolute values of conduction threshold voltages of the first cascode transistor and the third cascode transistor.

12. The linear regulator circuit having fast transient response of claim 10, wherein the gate of the sixth, the eighth and the tenth cascode transistor are coupled to the gain node, wherein a voltage of the gain node corresponds to the second bias voltage, wherein absolute values of conduction threshold voltages of the sixth, the eighth and the tenth cascode transistor are smaller than absolute values of conduction threshold voltages of the fifth, the seventh and the ninth cascode transistor.

13. The linear regulator circuit having fast transient response of claim 9, wherein the output power switch is configured as a PMOS transistor.

14. The linear regulator circuit having fast transient response of claim 10, wherein the at least one pre-stage amplifier circuit includes a first pre-stage amplifier circuit and a second pre-stage amplifier circuit, which are in complementary configuration, wherein the first conductive type of the first pre-stage amplifier circuit corresponds to N-type and the second conductive type of the first pre-stage amplifier circuit corresponds to P-type, and the first conductive type of the second pre-stage amplifier circuit corresponds to P-type and the second conductive type of the second pre-stage amplifier circuit corresponds to N-type.

15. The linear regulator circuit having fast transient response of claim 10, wherein when operating in a quiescent state, each differential transistor and each cascode transistor operate in a subthreshold region.

16. A linear regulator circuit having fast transient response, comprising:

an error amplifier circuit, configured to operably amplify a difference between a feedback signal and a reference signal to generate an error amplified signal at a driving node;

an output stage circuit, including at least one output power switch which is controlled by the error amplified signal to generate an output signal at an amplifying output node; and a regulation feedback circuit, configured to operably generate the feedback signal according to the output signal;

wherein the error amplifier circuit includes:
  at least one pre-stage amplifier circuit which includes:
    a current source circuit, configured to operably provide a bias current at a common source node of the pre-stage amplifier circuit;
    a differential gain stage circuit, configured to operably generate a gain output voltage of a gain node according to a voltage difference between a pre-stage first input terminal and a pre-stage second input terminal of the pre-stage amplifier circuit;
    a first transconductor circuit, configured to operably generate a feedback current at the common source node according to the gain output voltage;
    a second transconductor circuit, configured to operably generate a fourth output current according to the gain output voltage, for generating a pre-stage amplified signal at a pre-stage output terminal of the pre-stage amplifier circuit, wherein the differential gain stage circuit and the first transconductor circuit form a positive potential feedback (PPFB) loop; and
    at least one feedback capacitor, coupled between a pre-stage third input terminal of the pre-stage amplifier circuit and at least one inverting node of the pre-stage amplifier circuit, wherein on a signal feedforward path, a voltage of each of the inverting nodes has an inverting relationship with a voltage of the amplifying output node;
  wherein one of the pre-stage first input terminal and the pre-stage second input terminal of each pre-stage amplifier circuit is coupled to the feedback signal, and the other one is coupled to the reference signal, and the pre-stage third input terminal is coupled to the amplifying output node, and the pre-stage output terminal is coupled to the driving node, and the pre-stage amplified signal corresponds to the error amplified signal;
  wherein when a transient signal occurs at the amplifying output node, an acceleration signal is generated at the corresponding inverting node through the at least one feedback capacitor, to accelerate the transient response of the output signal.

17. The linear regulator circuit having fast transient response of claim 16, wherein the at least one feedback capacitor of each pre-stage amplifier circuit includes a first feedback capacitor, coupled between the pre-stage third input terminal of the pre-stage amplifier circuit and an inverting node on the PPFB loop.

18. The linear regulator circuit having fast transient response of claim 17, wherein the first feedback capacitor is coupled between the pre-stage third input terminal of the corresponding pre-stage amplifier circuit and the common source node, whereby when a transient signal occurs at the pre-stage third input terminal, a first acceleration signal is generated at the common source node to accelerate a transient response of a current on the PPFB loop, whereby the transient response of the output signal is accelerated.

19. A signal amplifier circuit, comprising:
an error amplifier circuit, configured to operably amplify a voltage difference between a first input signal and a second input signal to generate an error amplified signal at a driving node; and an output stage circuit, including at least one output power switch which is controlled by the error amplified signal to generate an output signal at an amplifying output node;

wherein the error amplifier circuit includes:
  at least one pre-stage amplifier circuit which includes:
    a current source circuit, configured to operably provide a bias current at a common source node of the pre-stage amplifier circuit;
    a differential input circuit, including a first differential transistor and a second differential transistor, wherein a source of the first differential transistor and a source of the second differential transistor are coupled together at the common source node, and a gate of the first differential transistor is coupled to a pre-stage first input terminal of the pre-stage amplifier circuit, and a gate of the second differential transistor is coupled to a pre-stage second input terminal of the pre-stage amplifier circuit, wherein the first differential transistor and the second differential transistor are configured to operably generate a differential output current according to a voltage difference between the pre-stage first input terminal and the pre-stage second input terminal;
    a first current mirror circuit, coupled with a drain of the second differential transistor at a differential stage output node of the pre-stage amplifier circuit, and configured to operably generate a first output current at a gain node according to the differential output current;
    a second current mirror circuit, configured to operably generate a second output current at the common source node according to the first output current;
    a third current mirror circuit, configured to operably generate a pre-stage amplified signal at a pre-stage output terminal of the pre-stage amplifier circuit according to the first output current, wherein the first current mirror circuit, the second differential transistor and the second current mirror circuit form a positive potential feedback (PPFB) loop; and
    at least one feedback capacitor, coupled between a pre-stage third input terminal of the pre-stage amplifier circuit and at least one inverting node of the pre-stage amplifier circuit, wherein on a signal feedforward path, a voltage of each of the inverting nodes has an inverting relationship with a voltage of the amplifying output node;
  wherein one of the pre-stage first input terminal and the pre-stage second input terminal of each pre-stage amplifier circuit receives the first input signal, and the other one receives the second input signal, and the pre-stage third input terminal is coupled to the amplifying output node, and the pre-stage output terminal is coupled to the driving node, and the pre-stage amplified signal corresponds to the error amplified signal;

wherein when a transient signal occurs at the amplifying output node, an acceleration signal is generated at the corresponding inverting node through the at least one feedback capacitor, to accelerate the transient response of the output signal.

* * * * *